(12) United States Patent
Sato et al.

(10) Patent No.: US 8,017,689 B2
(45) Date of Patent: Sep. 13, 2011

(54) COMPOSITION OF EPOXY RESIN, CORE-SHELL PARTICLES AND CURING AGENT

(75) Inventors: Nao Sato, Hiratsuka (JP); Kazunori Ishikawa, Hiratsuka (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 1 day.

(21) Appl. No.: 12/534,461

(22) Filed: Aug. 3, 2009

(65) Prior Publication Data
US 2010/0036022 A1  Feb. 11, 2010

(30) Foreign Application Priority Data

| Aug. 8, 2008 | (JP) | 2008-205377 |
| Sep. 26, 2008 | (JP) | 2008-248095 |
| Nov. 6, 2008 | (JP) | 2008-285058 |

(51) Int. Cl.
  *C08L 63/00* (2006.01)
  *C08L 63/02* (2006.01)
  *C08L 63/04* (2006.01)
  *C08L 51/04* (2006.01)

(52) U.S. Cl. ...... 525/65

(58) Field of Classification Search ............ None
See application file for complete search history.

(56) References Cited

U.S. PATENT DOCUMENTS

| 6,239,215 B1 * | 5/2001 | Morita et al. ............ 525/65 |
| 2007/0251419 A1 * | 11/2007 | Yamaguchi et al. ...... 106/287.13 |
| 2008/0029200 A1 * | 2/2008 | Sheasley ............ 156/79 |

FOREIGN PATENT DOCUMENTS

| JP | 5-214310 A | * | 8/1993 |
| JP | H05-214310 A | | 8/1993 |
| JP | 6-264045 A | * | 9/1994 |
| WO | WO 93/21274 A1 | * | 10/1993 |
| WO | WO 01/88034 A1 | * | 11/2001 |

* cited by examiner

*Primary Examiner* — Robert Sellers
(74) *Attorney, Agent, or Firm* — Global IP Counselors, LLP

(57) ABSTRACT

This invention relates to an epoxy resin composition which has better adhesive performance and flexibility at low temperatures (about −20° C.) to normal temperature as well as elevated temperatures (about 80° C.) and is suitable for use as a structural adhesive. The epoxy resin composition includes 100 mass parts epoxy resin, 5 to 100 mass parts core-shell particles, and a curing agent. 1 to 50 mass % of the epoxy resin is a urethane-modified epoxy resin and the core-shell particles include acrylonitrile in the monomer used during the production of the shell layer, and/or comprise a structure having at least three layers of a core layer, an interlayer, and a shell layer.

9 Claims, No Drawings

COMPOSITION OF EPOXY RESIN, CORE-SHELL PARTICLES AND CURING AGENT

BACKGROUND OF THE INVENTION

1. Field of the Invention

The present invention relates to an epoxy resin composition.

2. Background Information

Adhesive strength and flexibility at low temperatures as well as at elevated temperatures are sometimes required of structural adhesives.

For example, methods combining spot-welding and adhesives (weld-bonding) have been adopted to provide body rigidity, strength, and other attributes to automotive vehicles in components such as roof rails and various pillars, and the adhesives employed in such weld-bonding preferably have high adhesive strength on steel sheets at elevated temperatures of about 80° C. This is because components such as roof rails and various pillars sometimes become very hot while the vehicle is travelling. This is also because the number of spots in spot welding can be reduced if the adhesive strength is high.

Also, for example, components referred to as openings (lidded), such as the hood, doors, and trunk lid, are basically constructed of outer plates (outer panels) and inner plates (inner panels), and a crimping structure referred to as a "hemming" is used along virtually the entire periphery of the ends, but the adhesive used to affix the hemming part will preferably have adhesive strength and flexibility at elevated temperature. This is because the hemming sometimes heats up to an elevated temperature of about 80° C. while the automotive vehicle is travelling. It is also because stress is not dispersed and tends to become concentrated at one point when a load is imposed on locations where the hemming is bonded.

An example related to such an adhesive is disclosed in Patent Document 1: JP-A 5-214310.

Patent Document 1 discloses a pseudo-curable epoxy resin adhesive composition characterized by comprising (A) a specific epoxy resin, (B) a core-shell powdered polymer with specific properties having a two-layered core/shell structure, and (C) a thermally activated curing agent as essential components. This type of composition is disclosed as being characterized by better adhesive performance, such as impact resistance and tensile shear strength or T-peel strength, and by good pseudo-curability and the like.

SUMMARY OF THE INVENTION

However, even though the adhesive comprising the two-layered core-shell powder disclosed in Patent Document 1 has high strength from low temperature to about normal temperature, the strength decreases at an elevated temperature of about 80° C.

The present invention provides an epoxy resin composition which has better adhesive performance and flexibility at low temperatures (about −20° C.) to normal temperature as well as elevated temperatures (about 80° C.), and which is suitable for use as a structural adhesive.

The present invention comprises the following (1) through (6).

(1) An epoxy resin composition, comprising: 100 mass parts of an epoxy resin (A), 5 to 100 mass parts of core-shell particles (B), and a curing agent (C), wherein 1 to 50 mass % of the epoxy resin (A) is a urethane-modified epoxy resin, and the core-shell particles (B) have acrylonitrile included as a monomer used when a shell layer is produced, and/or have a structure of at least three layers of a core layer, an interlayer, and a shell layer.

(2) The epoxy resin composition according to (1) above, comprising: 100 mass parts of an epoxy resin (A), 5 to 100 mass parts of core-shell particles (B), and a curing agent (C), wherein 1 to 50 mass % of the epoxy resin (A) is a urethane-modified epoxy resin, and core-shell particles (B) have acrylonitrile included as a monomer used when a shell layer is produced, and have a structure of at least three layers of a core layer, an interlayer, and a shell layer.

(3) The epoxy resin composition according to (1) or (2) above, wherein the glass transition temperature of the shell layer is at least 50° C., and the glass transition temperature of the inner layer, which is adjacent to the shell layer, is no more than −30° C.

(4) The epoxy resin composition according to any of (1) through (3) above, wherein the core-shell particles (B) have the core layer, the interlayer, and the shell layer; the glass transition temperature of the core layer is at least 50° C.; the glass transition temperature of the interlayer is no more than −30° C.; and the glass transition temperature of the shell layer is at least 50° C.

(5) The epoxy resin composition according to any of (1) through (4) above, wherein the average of the primary particle diameters of the core shell particles (B) is 50 to 500 nm.

(6) The epoxy resin composition according to any of (1) through (5) above, which is used as a structural adhesive.

According to the present invention there can be provided an epoxy resin composition that has better adhesive performance and flexibility at low temperatures (about −20° C.) to normal temperature as well as elevated temperatures (about 80° C.), and that is suitable for use as a structural adhesive.

DETAILED DESCRIPTION OF THE PREFERRED EMBODIMENTS

The present invention will be described in detail.

The present invention is an epoxy resin composition, comprising: 100 mass parts of an epoxy resin (A), 5 to 100 mass parts of core-shell particles (B), and a curing agent (C), wherein 1 to 50 mass % of the epoxy resin (A) is a urethane-modified epoxy resin, and core-shell particles (B) have acrylonitrile included as a monomer used when a shell layer is produced, and/or have a structure of at least three layers of a core layer, an interlayer, and a shell layer.

This type of epoxy resin composition is also referred to below as "the composition of the present invention."

The composition of the present invention may also be one that is based on an epoxy resin (A), core-shell particles (B), and a curing agent (C). "Based" means at least 60 mass %. Specifically, the total amount of the epoxy resin (A), core-shell particles (B), and curing agent (C) contained in the composition of the present invention may be 60 mass % or more. The proportion is preferably at least 70 mass %, and more preferably at least 80 mass %.

The epoxy resin (A) will be described.

1 to 50 mass % of the epoxy resin (A) included in the composition of the present invention is a urethane-modified epoxy resin. Specifically, the epoxy resin (A) is a mixture of a urethane-modified resin and another epoxy resin. The other epoxy resin may be composed of a plurality of resins.

The structure of the urethane-modified epoxy resin (A) is not particularly limited as long as the molecule has a urethane bond and an epoxy group, but in terms of the ability to efficiently introduce a urethane bond and epoxy group in each molecule, it is preferably a resin obtained by reaction between a hydroxyl group-containing epoxy compound (Y) and a urethane bond-containing compound (X) having isocyanate groups, which is obtained by reaction between a polyhydroxy compound and a polyisocyanate compound.

Examples of such polyhydroxy compounds include polyether polyols and polyester polyols. Examples of polyether polyols include products obtained by addition polymerization of a lower alkylene oxide such as ethylene oxide, propylene oxide, and butylene oxide, or a cyclic ether such as tetrahydrofuran, using a compound having 2 or more active hydrogens, such as a low-molecular-weight polyhydric alcohol, an amine, a polyhydric phenol, or water, as an initiator. Examples of low molecular weight polyhydric alcohols include ethylene glycol, 1,2-propylene glycol, 1,3-propylene glycol, 1,2-butane diol, 1,3-butane diol, 1,4-butane diol, neopentyl glycol, 1,6-hexane diol, hydrogenated bisphenol A, glycerin, trimethylol propane, and pentaerythritol. Examples of amines include ammonium, ethylene diamine, hexamethylene diamine, ethanolamine, and propanolamine. Examples of polyhydric phenols include resorcinol, hydroquinone, bisphenol A, bisphenol F, and bisphenol S.

Examples of polyester polyols include condensates of the above low molecular weight polyhydric alcohols or polyether polyols and polyvalent carboxylic acids, hydroxycarboxylic acids, or carbonic acid, and ring-opened lactones. Examples of polyvalent carboxylic acids include succinic acid, glutaric acid, adipic acid, sebacic acid, azelaic acid, maleic acid, phthalic acid, isophthalic acid, terephthalic acid, trimellitic acid, and pyromellitic acid. Examples of hydroxycarboxylic acids include 12-hydroxystearic acid and castor oil fatty acid. Examples of lactones include e-caprolactam.

Examples of polyhydroxy compounds include adducts of a hydroxycarboxylic acid and an alkylene oxide, polybutadiene polyols, and polyolefin polyols. Of these, polyether polyols are preferred because cured products with better adhesion, flexibility, and the like will be obtained when they are used. The molecular weight of the above polyhydroxy compounds is not particularly limited, but for the sake of a better balance between flexibility and curability, the use of one with a weight-average molecular weight in the range of 300 to 20,000, and particularly the range of 1,000 to 10,000, is preferred. This also includes chelate modification. Specific examples include EPU-78-11, EPU-1395, EPU-6E, and EPU-78-11S by ADEKA.

The components other than the urethane-modified epoxy resin forming the epoxy resin (A), specifically, the "other epoxy resins," are not particularly limited as long as they have at least 2 epoxy groups. Examples include bifunctional glycidyl ether type epoxy resins, which include epoxy compounds having bisphenyl groups, such as bisphenol A, bisphenol F, brominated bisphenol A, hydrogenated bisphenol A, bisphenol S, bisphenol AF, and biphenyl types, polyalkylene glycol and alkylene glycol type epoxy compounds, epoxy compounds with naphthalene rings, and epoxy compounds with fluorene groups; multifunctional glycidyl ether type epoxy resins, such as phenol novolac, ortho-cresol novolac, trishydroxyphenyl methane, trifunctional, and tetraphenylol ethane types; synthetic fatty acid glycidyl ester type epoxy resins such as dimer acids; aromatic epoxy resins with glycidyl amino groups such as N,N,N',N'-tetraglycidyl diamino diphenyl methane (TGDDM), tetraglycidyl-m-xylylene diamine, triglycidyl-p-aminophenol, and N,N-diglycidyl aniline; and epoxy compounds with a tricyclo[5.2.1.0$_{2,6}$] decane ring (for example, epoxy compounds obtained by a manufacturing method in which the polymerization of dicyclopentadiene and a cresol such as m-cresol or a phenol is followed by a reaction with epichlorohydrin).

Examples of other epoxy resins include epoxy resins with a sulfur atom in the epoxy resin main chain such as FLEP-10 by Toray Fine Chemicals; rubber-modified epoxy resins containing rubber such as polybutadiene, liquid polacrylonitrile-butadiene rubber, and acrylonitrile-butadiene rubber (NBR); and epoxy resins with acetoacetate groups in their molecules, such as bisphenol A type epoxy resins, bisphenol F type epoxy reins, sorbitol type epoxy resins, polyglycerol type epoxy resins, pentaerythritol type epoxy resins, and trimethylol propane type epoxy resins.

For the sake of ever better adhesive performance and flexibility from low to elevated temperatures, the epoxy resin (A) preferably includes at least one of either a bisphenol A type epoxy resin or rubber-modified epoxy resin as the other epoxy resin. Bisphenol A type epoxy resins containing at least 220 epoxy equivalents are preferred.

In bisphenol A type epoxy resins with at least 220 epoxy equivalents, the epoxy equivalents preferably range from 220 to 300 g/eq for the sake of even better adhesive performance and flexibility from low to elevated temperatures.

The amount of the bisphenol A type epoxy resin with at least 220 epoxy equivalents in the epoxy resin (A) is preferably 0 to 99 mass %, and more preferably 0 to 50 mass %, for the sake of even better adhesive performance and flexibility from low to elevated temperatures.

The rubber-modified epoxy resin is not particularly limited, as long as it is an epoxy resin with at least 2 epoxy groups and a rubber skeleton. Examples of rubber for forming the skeleton include polybutadiene, acrylonitrile-butadiene rubber (NBR), and carboxyl group-terminated NBR (CTBN).

The epoxy equivalents of the rubber-modified epoxy resin preferably range from 200 to 350 g/eq for the sake of even better adhesive performance and flexibility from low to elevated temperatures.

Rubber-modified epoxy resins may be used alone or in combinations of two or more.

The amount of the rubber-modified epoxy resin in the epoxy resin (A) is preferably 0 to 99 mass %, and more preferably 0 to 60 mass %, for the sake of even better adhesive performance and flexibility from low to elevated temperatures.

The manufacture of the rubber-modified epoxy resin is not particularly limited. For example, it can be manufactured by a reaction between rubber and epoxy in a large amount of epoxy. The epoxy (for example, epoxy resin) used to manufacture the rubber-modified epoxy resin is not particularly limited. Examples include those which are conventionally well-known.

In the present invention, the epoxy equivalents of the rubber-modified epoxy resin and the amount added will include the excess epoxy resin used during the manufacturing process and thus indicate the amount in terms of "rubber-modified epoxy resin containing that epoxy."

The proportion of the urethane-modified epoxy resin in the epoxy resin (A) is 1 to 50 mass %, and preferably 2 to 30 mass %. That is because a proportion that is too little will result in poor adhesion on steel panels, and too much will result in lower adhesive strength. The role of the urethane-modified epoxy is to provide flexibility at the interface with steel panels through the localization of the urethane-modified epoxy resin, which has high polarity, at the interface with steel panels. Core-shells alone will not provide sufficient flexibility near the interface with steel panels, whereas high adhesive strength can be developed with the combined use of urethane-modified epoxy and core-shells.

In the present invention, the proportion of the urethane-modified epoxy resin in the epoxy resin (A) is determined from the amount of the urethane-modified epoxy resin that is added during the manufacture of the composition of the present invention.

The core-shell particles (B) will be described.

The core-shell particles (B) included in the composition of the present invention have at least a core layer and a shell layer, and comprise particles in which the monomer used to produce the shell layer includes acrylonitrile (core-shell particles (B1)), and/or particles having at least a three-layer structure made of a core layer, an interlayer, and a shell layer (core-shell particles (B2)).

The core-shell particles (B1) will be described.

In the core-shell particles (B1), the glass transition temperature of the shell layer is at least 50° C., and the glass transition temperature of the inner layer adjacent to the shell layer is preferably no more than −30° C., for the sake of even better adhesive performance and flexibility from low to elevated temperatures.

The core-shell particles (B1) also preferably have two layers and/or (*1) three layers for the sake of even better adhesive performance and flexibility from low to elevated temperatures.

When the core-shell particles (B1) have a two-layered structure, the inner layer adjacent to the shell layer will be the core layer, and the glass transition temperature of the core layer will be no more than −30° C.

When the core-shell particles (B1) have a three-layered structure, the core-shell particles (B1) will have an interlayer as the inner layer adjacent to the shell layer, and the glass transition temperature of the interlayer will be no more than −30° C. The three-layered core-shell particles (B1) can have a core layer, with a glass transition temperature of at least 50° C., in the center, an interlayer with a glass transition temperature no more than −30° C. covering the core layer, and a shell layer as the outermost shell with a glass transition temperature of at least 50° C. covering the interlayer.

The core-shell particles (B1) may also have a structure of 4 or more layers. They may be a four-layered structure, for example, having a layer with a glass transition temperature under 50° C. in the interior of the above core layer.

The layers forming the core-shell particles (B1) will be described.

The shell layer will be described first.

In the present invention, the shell layer is the outermost shell layer of the core-shell particles (B1), and the monomer used to produce the shell layer will more preferably include acrylonitrile. The shell layer can prevent the aggregation of core-shell particles.

In the present invention, the monomer used during the production of the shell layer includes acrylonitrile.

In the present invention, having the monomer used during the production of the shell layer include acrylonitrile, which has high polarity, increases compatibility with, and dispersibility in, the matrix epoxy resin (A).

The polymer forming the shell layer can also have nitrile groups, and the nitrile groups can form hydrogen bonds with the hydroxyl groups that are produced when the epoxy resin (A) is cured. The nitrile groups can also act on the interface with the adherend (for example, a steel panel) and increase the adhesion.

The hydrogen bonds with the epoxy resin (A) that are formed by the nitrile groups, and/or the action on the adherend thus enables the composition of the present invention to have better adhesive performance and better flexibility from low to elevated temperature.

The monomer used during the manufacture of the shell layer can also include, in addition to acrylonitrile, aromatic vinyl monomers and non-aromatic monomers other than acrylonitrile, as monomers that are copolymerizable with acrylonitrile.

Examples of aromatic vinyl monomers include styrene, vinyl toluene, a-methylstyrene, monochlorostyrene, 3,4-dichlorostyrene, and bromostyrene. Of these, styrene is preferred for the sake of even better adhesive performance and flexibility from low to elevated temperatures.

The amount of acrylonitrile is preferably is the range of no more than 70 mass %, and more preferably in the range of no more than 50 mass %, of the total amount of monomer used during the manufacture of the shell layer.

Examples of non-aromatic monomers other than acrylonitrile include alkyl acrylates such as methyl acrylate, ethyl acrylate, and butyl acrylate; alkyl methacrylates such as methyl methacrylate and butyl methacrylate; vinyl cyanides such as methacrylonitrile; and vinylidene cyanides.

The amount of the non-aromatic monomer other than acrylonitrile is preferably is the range of no more than 70 mass %, and more preferably in the range of no more than 50 mass %, of the total amount of monomer used during the manufacture of the shell layer.

The shell layer may be cross-linked with a cross-linkable monomer.

Examples of cross-linkable monomers that can be used during the manufacture of the shell layer include divinyl benzene and butylene glycol dimethacrylate. Divinyl benzene is particularly preferred for the sake of even better adhesive performance and flexibility from low to elevated temperatures. The amount of the cross-linkable monomer is usually in the range of no more than 30 mass %, preferably in the range of 0.5 to 20 mass %, and more preferably in the range of 5 to 15 mass %, of the total amount of monomer used during the manufacture of the shell layer.

In the present invention, styrene-acrylonitrile copolymers and styrene-acrylonitrile-divinyl benzene copolymers are preferred for the sake of even better adhesive performance and impact resistance from low to elevated temperatures.

In the present invention, the glass transition temperature of the shell layer in the core-shell particles (B1) is also preferably at least 50° C., and more preferably 70 to 150° C., for the sake of even better adhesive performance and flexibility from low to elevated temperatures.

In the present invention, the glass transition temperature refers to the temperature at the tand peak value during dynamic viscoelastic measurement.

The inner layer adjacent to the shell layer will be described next.

The glass transition temperature of the inner layer adjacent to the shell layer is preferably no more than −30° C., more preferably −110 to −30° C., and even more preferably −110 to −40° C., for the sake of even better adhesive performance and flexibility from low to elevated temperatures.

Examples of monomers which can be used during the manufacture of the inner layer adjacent to the shell layer include butadiene and alkyl acrylate esters with $C_2$ to $C_8$ alkyl groups.

Examples of alkyl acrylate esters with $C_2$ to $C_8$ alkyl groups include ethyl acrylate, propyl acrylate, butyl acrylate, cyclohexyl acrylate, and 2-ethylhexyl acrylate.

In addition to butadiene and alkyl acrylate esters with $C_2$ to $C_8$ alkyl groups, other vinyl monomers that are copolymerizable therewith can also be used in the monomer which is used during the manufacture of the inner layer adjacent to the shell layer. Examples of other vinyl monomers that are copolymerizable with alkyl acrylate esters include aromatic vinyl compounds such as styrene, vinyl toluene, or a-methylstyrene, and aromatic vinylidene compounds, vinyl cyanides such as acrylonitrile or methacrylonitrile, and vinylidene cyanides, and alkyl methacrylates such as methyl methacrylate and butyl methacrylate.

The amount of the other vinyl monomer that is copolymerizable with alkyl acrylate esters or butadiene is usually in the range of no more than 50 wt %, and preferably in the range of no more than 30 wt %, relative to the entire amount of the monomer used during the manufacture of the inner shell adjacent to the shell layer.

The inner shell adjacent to the shell layer may be cross-linked with a cross-linkable monomer. The cross-linkable monomers are the same as those noted above. The amount of cross-linkable monomer is usually in the range of 0.01 to 5 mass %, and preferably in the range of 0.1 to 2 mass %, of the total amount of monomer which can be used during the manufacture of the inner layer adjacent to the shell layer.

The monomer which can be used during the manufacture of the inner layer adjacent to the shell layer can also include grafted monomers. Grafted monomers are not particularly limited.

Described below is the core shell in cases where the core-shell particles (B1) are three-layered.

Examples of monomers which can be used during the manufacture of the core layer in three-layered core-shell particles (B1) include aromatic vinyl monomers. The aromatic vinyl monomers are the same as those noted above.

The monomer which can be used during the manufacture of the core layer in three-layered core-shell particles (B1) can also include non-aromatic monomers and cross-linkable monomers in addition to aromatic vinyl monomers.

Examples of non-aromatic monomers include alkyl acrylates such as ethyl acrylate and butyl acrylate, alkyl methacrylates such as methyl methacrylate and butyl methacrylate, and vinyl cyanides such as acrylonitrile and methacrylonitrile, and vinylidene cyanides. The amount of non-aromatic monomer that is used is preferably in the range of no more than 50 mass %, and more preferably in the range of no more than 20 mass %, of the total amount of monomer which can be used during the manufacture of the core layer.

The core layer in three-layered core-shell particles (B1) may also be cross-linked with a cross-linkable monomer.

Examples of cross-linkable monomers include monomers having at least two polymerizable ethylenic unsaturated bonds per molecule. Specific examples include aromatic divinyl monomers such as divinyl benzene, and alkane polyol-poly(meth)acrylates such as ethylene glycol-di(meth)acrylate, butylene glycol-di(meth)acrylate, hexane diol-(meth)acrylate, oligoethylene glycol-di(meth)acrylate, trimethylol propane-di(meth)acrylate, and trimethylol propane-tri(meth)acrylate. Divinyl benzene is particularly preferable among these.

The amount of the cross-linkable monomer is usually in the range of no more than 30 mass %, preferably in the range of 0.5 to 20 mass %, and more preferably in the range of 5 to 15 mass %, of the total amount of monomer which can be used during the manufacture of the core layer.

The monomer which can be used during the manufacture of the core layer in three-layered core-shell particles (B1) can also include grafted monomers.

The glass transition temperature of the core layer in three-layered core-shell particles (B1) is preferably at least 50° C. The glass transition temperature of the core layer is more preferably 50 to 200° C., and even more preferably 80 to 200° C. This is because a composition of the present invention having adhesive strength at even higher temperatures will be obtained.

In the present invention, the average of the primary particle diameter of the core-shell particles (B1) is preferably 50 nm to 500 nm, and more preferably 50 to 300 nm. This is because the core-shell particles will tend not to aggregate, thus resulting in good workability. It is also because the composition of the present invention will have even greater adhesive strength.

The mean primary particle diameter of the core-shell particles means the value that is obtained through measurement using a zeta-potential particle size distribution analyzer (by Beckman Coulter).

The core-shell particles (B1) may be used alone or in combinations of two or more.

The manufacture of the core-shell particles (B1) is not particularly limited. Examples include those which are conventionally well-known.

In the present invention, the amount of the core-shell particles (B1) is 5 to 100 mass parts per 100 mass parts epoxy resin (A) in order to improve the adhesive performance and flexibility from low to elevated temperatures as well as to minimize adhesive failure. The amount of the core-shell particles (B1) is also preferably 5 to 100 mass parts, and more preferably 10 to 100 mass parts, per 100 mass parts epoxy resin (A), for the sake of even better adhesive performance and flexibility from low to elevated temperatures.

The core-shell particles (B2) will be described next.

The core-shell particles (B2) preferably have a structure in which a cross-linked rubber layer exhibiting rubber elasticity (interlayer) is covered with a cross-linked polymer that does not exhibit rubber elasticity (shell layer), wherein the glass transition temperature of the core layer on the inside of the cross-linked rubber layer is at least 50° C.

In cases where, for example, the core-shell particles (B2) are three-layered, roughly spherical particles, the particles will have a core layer, with a glass transition temperature of at least 50° C., in the center, an interlayer with a glass transition temperature no more than −30° C. covering the core layer, and a shell layer as the outermost shell with a glass transition temperature of at least 50° C. covering the interlayer.

The core-shell particles (B2) may also have a structure of 4 or more layers. They may be a four-layered structure, for example, having a layer with a glass transition temperature of no more than 50° C. in the interior of the above core layer.

The layers forming the core-shell particles (B2) will now be described.

The core layer will be described first.

As noted above, the core layer is the part that is present near the center of the core-shell particles (B2).

The material forming the core layer is not particularly limited, but is preferably a substance with a glass transition temperature of at least 50° C. The temperature is more preferably 50 to 200° C., and even more preferably 80 to 200° C. This is because a composition of the present invention having adhesive strength at even higher temperatures will be obtained.

The core layer is preferably composed of a polymer obtained through the polymerization of methyl methacrylate and/or styrene monomer, or a polymer obtained through the copolymerization of a monomer that is copolymerizable therewith.

Examples of monomers that are copolymerizable with methyl methacrylate and/or styrene include alkyl acrylates such as ethyl acrylate and butyl acrylate, alkyl methacrylates such as ethyl methacrylate and butyl methacrylate, and vinyl polymerizable monomers, including aromatic vinyls such as vinyl toluene and a-methylstyrene, aromatic vinylidenes, vinyl cyanides such as acrylonitrile or methacrylonitrile, and vinylidene cyanides. Of these, ethyl acrylate or acrylonitrile is preferred. Monomers having functional groups such as epoxy groups, carboxyl groups, hydroxyl groups, and amino groups can also be copolymerized. Examples of monomers having epoxy groups include glycidyl methacrylate. Examples of monomers having carboxyl groups include methacrylic acid, acrylic acid, maleic acid, and itaconic acid. Examples of monomers having hydroxyl groups include 2-hydroxy methacrylate and 2-hydroxy acrylate.

A cross-linkable monomer or graft monomer is preferably used within the range of 10 wt % as the monomer that is copolymerizable with methyl methacrylate or styrene. This is because bonding will be obtained between the layers, and the particles will tend not to become deformed even when heated.

Examples of cross-linkable monomers include aromatic divinyl compounds such as divinyl benzene, and alkane polyol-polyacrylates such as hexane diol-diacrylate and norbornene-dimethylol dimethacrylate. Examples of graft monomers include unsaturated alkyl carboxylate esters such as allyl methacrylate.

The interlayer will be described next.

The interlayer is the layer present on the outside of the core layer.

The material forming the interlayer is not particularly limited, but is preferably a substance with a glass transition temperature no more than −30° C. The temperature is more preferably −110 to −30° C., and even more preferably −110 to 40° C. This is to allow the elastic modulus to be lowered and the peel strength to be increased at lower temperatures.

In cases where the core-shell particles (B2) are structures having 4 or more layers with at least 2 interlayers, at least one of the interlayers is preferably composed of a substance with a glass transition temperature no more than −30° C.

The interlayer is preferably composed of a polymer obtained through the polymerization of a conjugated diene and/or alkyl acrylate with $C_2$ to $C_8$ alkyl groups, or a polymer obtained through the copolymerization of a monomer that is copolymerizable therewith.

Examples of conjugated dienes include butadiene, isoprene, and chloroprene, of which butadiene is preferred.

Examples of alkyl acrylates with $C_2$ to $C_8$ alkyl groups include ethyl acrylate, propyl acrylate, butyl acrylate, cyclohexyl acrylate, and 2-ethylhexyl acrylate, among which butyl acrylate is preferred.

Examples of monomers that are copolymerizable with conjugated dienes or alkyl acrylates include aromatic vinyls such as styrene, vinyl toluene, and a-methylstyrene, aromatic vinylidenes, vinyl cyanides such as acrylonitrile or methacrylonitrile, vinylidene cyanides, alkyl methacrylates such as methyl methacrylate and butyl methacrylate, and aromatic (meth)acrylates such as benzyl acrylate, phenoxyethyl acrylate, and benzyl methacrylate. Monomers having functional groups such as epoxy groups, carboxyl groups, hydroxyl groups, and amino groups can also be copolymerized. Examples of monomers having epoxy groups include glycidyl methacrylate, and examples of monomers having carboxyl groups include methacrylic acid, acrylic acid, maleic acid, and itaconic acid. Examples of monomers having hydroxyl groups include 2-hydroxy methacrylate and 2-hydroxy acrylate.

A cross-linkable monomer or graft monomer is preferably used in small amounts as the monomer that is copolymerizable with conjugated dienes or alkyl acrylates. This is because bonding will be obtained between the layers, and the particles will tend not to become deformed even when heated.

Specifically, the cross-linkable monomer or graft monomer which can be used to form the core layer may be used within the range of 10 wt %.

The shell layer will be described next.

As noted above, the shell layer is the outermost shell layer covering the interlayer, and is intended to prevent the aggregation of the core-shell particles.

The material forming the shell layer for that purpose is not particularly limited, but is preferably a substance with a glass transition temperature of at least 50° C. in the same manner as the core shell. The preferred glass transition temperature is also the same, and the materials that can preferably be used are also the same.

In the present invention, the mean of the primary particle diameter of the core-shell particles (B2) is preferably 50 nm to 500 nm, and more preferably 50 to 300 nm. This is because the core-shell particles will tend not to aggregate, thus resulting in good workability. It is also because the composition of the present invention will have even greater adhesive strength.

The mean primary particle diameter of the core-shell particles means the value that is obtained through measurement using a zeta-potential particle size distribution analyzer (by Beckman Coulter).

The core-shell particles (B2) are preferably 10 to 100 mass parts, more preferably 20 to 100 mass parts, and even more preferably 25 to 80 mass parts, per 100 mass parts epoxy resin (A). This is because the flexibility of the composition of the present invention will be further increased, and the strength of the adhesive will be even more sufficient.

The core-shell particles (B2) can be produced by a well-known method for producing common core-shell polymers. For example, the particles can be produced by sequentially forming the core layer, interlayer, and shell layer through the stepwise addition of the desired monomers to the reaction system in accordance with a well-known seed polymerization method.

When core-shell particles (B1) and core-shell particles (B2) are mixed and used, the materials may be the same or different. When the materials are different, they can be mixed within the various mixing proportions given above relative to the epoxy resin (A).

The curing agent (C) is described next.

The curing agent (C) included in the composition of the present invention is not particularly limited, and can be one that is ordinarily used as a curing agent in epoxy resins. Dicyandiamide, 4,4'-diaminodiphenyl sulfone, imidazole derivatives such as 2-n -heptadecyl imidazole, dihydrazide isophthalate, N,N-dialkyl urea derivatives, N,N-dialkyl thiourea derivatives, acid anhydrides such as tetrahydrophthalic anhydride, isophorone diamine, m-phenylene diamine, N-aminoethyl piperazine, melamine, guanamine, boron trifluoride complexes, trisdimethylaminomethyl phenols, and the like can be used, for example. Two or more of these may be used in combination.

The content of the curing agent (C) in the composition of the present invention is also not particularly limited, and the optimum amount will vary depending on the type of curing agent. The optimum amounts of curing agents which are well known can preferably be used, for example. Optimum amounts are given, for example, in Chapter 3 of "General Introduction to Epoxy Resins, Basic Edition" (The Japan Society of Epoxy Resin Technology, published 2003).

In addition to the above epoxy resin (A), core-shell particles (B), and curing agent (C), the composition of the present invention can also include curing promoters, inorganic fillers, organic or polymer fillers, flame retardants, antistatic agents, electroconductivity-imparting agents, lubricants, slip-imparting agents, surfactants, colorants, and the like according to the intended application. Two or more types among these may be included.

The method for producing the composition of the invention is not particularly limited, and the composition can be produced, for example, by a conventionally known method. The composition can be obtained, for example, by uniformly kneading the epoxy resin (A), core-shell particles (B), curing agent (C), and other components such as a curing promoter, as needed, at room temperature.

The composition of the present invention has better adhesive performance and flexibility at low temperatures (about −20° C.) to normal temperature as well as elevated temperatures (about 80° C.). The composition of the present invention is thus suitable as a structural adhesive. As used here, "structural adhesive" is a highly reliable adhesive with no loss of adhesive properties even under substantial, long-lasting loads (JIS (Japanese Industrial Standards) K6800). It can be used, for example, as an adhesive for structural members in the fields of automotive vehicles or rolling stock (for high-speed trains or electrical trains), engineering, construction, electronics, aircraft, and the aerospace industry.

EXAMPLES

Examples are given below to illustrate the invention in greater detail. However, the invention is not limited to these examples.

Examples 1 to 5, and Comparative Example 1

Manufacture of Epoxy Resin Composition

The components shown in Table 1 were used in the amounts (mass parts) shown in the table 1, and were uniformly mixed to obtain compositions of the present invention.
Evaluation The epoxy resin compositions obtained in the manner noted above were applied to a thickness of 0.1 to 0.2 mm on the surface of non-plated steel panels to test the tensile shear strength and T-peel strength. Both tests were conducted in accordance with JIS K-6850 (1999). Test pieces (non-plated steel panels) measuring 0.8 mm×25 mm×200 mm were used. The test results are shown in Table 1. The fracture morphology was also checked in the T-peel strength test at 80° C. The test results are shown in Table 1.

Details on the components shown in Table 1 are given below.

Epoxy resin (A)1: Bisphenol A type epoxy resin, epoxy equivalents 190 g/eq (JER828, Japan Epoxy Resins Co., Ltd.)

Epoxy resin (A)2: Urethane-modified epoxy resin, epoxy equivalents 211 g/eq (EPU-78-11, polyol component: polypropylene glycol (PG); polyisocyanate component: tolylene diisocyanate (TDI), ADEKA)

Epoxy resin (A)3: Rubber-modified epoxy resin, epoxy equivalents 305 g/eq (EPR-1309, NBR modified BisA epoxy resin containing a BisA epoxy resin, ADEKA)

Core-shell particles (B1)1: Tradename IM-601 (by Ganz Chemical Co., Ltd., three-layered structure, polymer forming shell layer: acrylonitrile/styrene copolymer, mean primary particle diameter=200 to 300 nm; shell layer glass transition temperature: about 80° C. to 100° C.; interlayer glass transition temperature: about −50° C. to −60° C.; core layer glass transition temperature: about 80° C. to 100° C.)

Core-shell particles (B1)2: Core-shell particles were formed in accordance with the method disclosed in JP-A 2-191614 using butyl acrylate as the monomer forming the core, and acrylonitrile and styrene used as the monomer forming the shell. The resulting core-shell particles were used as core-shell particles (B1)2. Mean primary particle diameter of core-shell particles (B1)2: 200 to 300 nm, two-layered structure, shell layer component: acrylonitrile/styrene copolymer, shell layer glass transition temperature: about 80° C. to 100° C., core layer glass transition temperature: about −50° C. to −60° C.

Core-shell particles (B1)3: Tradename F-351 (by Ganz Chemical Co., Ltd., mean primary particle diameter: 200 to 300 nm, two-layered structure; shell layer component: MMA (methyl methacrylonitrile), shell layer glass transition temperature: about 100° C. to 120° C., core layer glass transition temperature: about −50° C. to −60° C.)

Curing agent (C): Dicyandiamide, tradename Dicy15 (Japan Epoxy Resins Co., Ltd.)

Catalyst: 3-(3,4-dichlorophenyl)-1,1-dimethyl urea, tradename DUMU99 (Hodogaya Chemical Co., Ltd.)

Filler: Silica (RY-200S, Nippon Aerosil Co., Ltd.)

As is apparent from the results shown in Table 1, Comparative Example 1, in which the monomer used during the production of the shell layer did not include acrylonitrile, was characterized by poor dispersion with the matrix resin and poor adhesion at elevated temperatures.

In contrast, Examples 1 to 5 had good tensile shear strength and T-peel strength at −20° C., room temperature, and 80° C.

Examples 1 to 3, which contained 10 to 100 mass parts of core-shell particles (B1) per 100 mass parts of the epoxy resin (A), also had higher core-shell particle (B1) dispersion and even better physical properties than Example 5.

Examples 1-3 and 5, which contained three-layered core-shell particles (B1), had better properties at higher temperatures than Example 4, which contained two-layered core-shell particles (B1).

Additionally, analysis of fracture morphology in the T-peel strength test at 80° C. revealed 60% cohesive failure in Comparative Example 1 but at least 80% cohesive failure in Examples 1 to 5. They were therefore highly reliable adhesives.

Adhesive failure is failure at the interface between the adhesives and the steel panels, which are the adherends, and cohesive failure is failure in the layers of the adhesive. Cohesive failure is the preferred form of failure in order to ensure that the adhesive and adherend adhere to each other. Adhesive failure is a state in which adhesive strength cannot be controlled, and is unreliable.

Examples 6 to 14

Bisphenol A type epoxy resin (JER828, Japan Epoxy Resins Co., Ltd.), urethane-modified epoxy resin (EPU-78-11, ADEKA), and rubber-modified epoxy resin (EPR-1309, ADEKA) were used as the epoxy resin (A), three-layered core-shell particles (I) (IM-601, Ganz Chemical Co., Ltd.: mean primary particle diameter=200 to 300 nm; shell: acrylonitrile-styrene) or three-layered core-shell particles (II) (IM-602, Ganz Chemical Co., Ltd.: mean primary particle diameter=200 to 300 nm; shell: methyl methacrylate) were used as the core-shell particles (B2), a curing agent (Dicy15, Japan Epoxy Resins Co., Ltd.) was used as the curing agent (C), a catalyst (DUMU99, Hodogaya Chemical Co., Ltd.) and silica (RY-200S, Nippon Aerosil Co., Ltd.) were also added, and the components were uniformly kneaded to obtain compositions of the present invention. The amounts (mass parts) in which the components were added in the examples are given in Table 2.

The compositions were applied on the surface of non-plated steel panels to test the tensile shear strength and T-peel strength. Both tests were conducted in accordance with JIS K-6850 (1999). Test pieces (non-plated steel panels) measuring 0.8 mm×25 mm×200 mm were used. The test results are shown in Table 2.

Comparative Example 2

The example was tested in the same manner as Example 6 except that 50 mass parts of a rubber-modified epoxy resin was used instead of the urethane-modified epoxy resin used in Example 6. The test results are shown in Table 2.

Comparative Example 3

The example was tested in the same manner as Example 8 except that two-layered core-shell particles (AC-3355, Ganz Chemical Co., Ltd.: mean primary particle diameter=400 to 500 nm) were used instead of the three-layered core-shell particles used in Example 3. The test results are shown in Table 2.

In Examples 6 to 14, the proportion of urethane-modified epoxy resin was 1 to 50 mass % of the entire epoxy resin, resulting in good tensile shear strength and T-peel strength at −20° C., room temperature, and 80° C.

The T-peel strength test at 80° C. also revealed the fracture morphology to be cohesive failure in all the examples of the invention. They were therefore highly reliable adhesives.

Failure includes "cohesive failure," which is failure in the layers of the adhesive, and "adhesive failure," which is separation between the adhesive and adherend (steel panel). Cohesive failure is the preferred form of failure in order to ensure that the adhesive and adherend adhere to each other. Adhesive failure is a state in which adhesive strength cannot be controlled, and is unreliable.

Although Examples 12-14 were characterized by cohesive failure, adhesive failure also occurred. "70% cohesive failure" in Example 12 in the table means both types of failure morphology were present, and that adhesive failure occurred in 30% of the area. The same is true in Examples 13 and 14.

In contrast, the use of the composition of Comparative Example 2, which did not contain a urethane-modified epoxy resin, resulted in lower strength than in Examples 6 to 14. The strength at elevated temperature (80° C.) in particular was lower than in Examples 6 to 14. The T-peel strength test at 80° C. also revealed the fracture morphology to be adhesive failure. It therefore was not a very reliable adhesive.

The use of the composition in Comparative Example 3, in which two-layered core-shells were used, resulted in lower strength than Examples 6 to 14 in the same manner as Comparative Example 2. The strength at elevated temperature (80° C.) in particular was lower than in Examples 6 to 14.

TABLE 1

| | | Examples | | | | | Comparative Example |
|---|---|---|---|---|---|---|---|
| | | 1 | 2 | 3 | 4 | 5 | 1 |
| Epoxy Resin (A) 1 | | 50 | 50 | 50 | 50 | 50 | 50 |
| Epoxy Resin (A) 2 | | 30 | 30 | 30 | 30 | 30 | 30 |
| Epoxy Resin (A) 3 | | 20 | 20 | 20 | 20 | 20 | 20 |
| Core-Shell Particles (B1) 1 | | 10 | 50 | 100 | | 5 | |
| Core-Shell Particles (B1) 2 | | | | | 50 | | |
| Core-Shell Particles (B1) 3 | | | | | | | 50 |
| Curing Agent (C) | | 6.5 | 6.5 | 6.5 | 6.5 | 6.5 | 6.5 |
| Catalyst | | 1.3 | 1.3 | 1.3 | 1.3 | 1.3 | 1.3 |
| Filler | | 5 | 5 | 5 | 5 | 5 | 5 |
| Tensile Shear Strength | @−20° C. [Mpa] | 20.5 | 21.2 | 20.0 | 18.5 | 19.0 | 14.5 |
| | @Room Temperature [Mpa] | 28.5 | 29.2 | 30.0 | 21.5 | 25.0 | 15.1 |
| | @80° C. [Mpa] | 19.5 | 20.5 | 19.5 | 16.8 | 17.0 | 13.0 |
| T-Peel Strength | @−20° C. [N/25 mm] | 305 | 310 | 305 | 280 | 300 | 160 |
| | @Room Temperature [N/25 mm] | 250 | 240 | 255 | 220 | 220 | 150 |
| | @80° C. [N/25 mm] | 240 | 240 | 240 | 185 | 195 | 120 |
| Fracture morphology in T-Peel Strength Test at 80° C. | | Cohesive Failure | Cohesive Failure | Cohesive Failure | Cohesive 80% Interfacia 20% | Cohesive 80% Interfacial 20% | Cohesive 60% Interfacial 40% |

TABLE 2

| | | Example 6 | Example 7 | Example 8 | Example 9 | Example 10 | Example 11 |
|---|---|---|---|---|---|---|---|
| BisA Epoxy Resin [mass parts] | | 50 | 50 | 50 | 50 | 50 | 50 |
| Urethane-Modified Epoxy Resin [mass parts] | | 5 | 10 | 30 | 50 | 30 | 30 |
| Rubber-Modified Epoxified Resin [mass parts] | | 45 | 40 | 20 | 0 | 20 | 20 |
| 3-Layered Core-Shell Particles (I) [mass parts] | | 30 | 30 | 30 | 30 | 50 | 75 |
| 3-Layered Core-Shell Particles (II) [mass parts] | | | | | | | |
| 2-Layered Core-Shell Particles [mass parts] | | | | | | | |
| Curing Agent [mass parts] | | 6.5 | 6.5 | 6.5 | 6.5 | 6.5 | 6.5 |
| Catalyst [mass parts] | | 1.3 | 1.3 | 1.3 | 1.3 | 1.3 | 1.3 |
| Silica [mass parts] | | 5 | 5 | 5 | 5 | 5 | 5 |
| Tensile Shear Strength | @−20° C. (Mpa) | 18.5 | 20.0 | 21.5 | 16.2 | 21.2 | 20.4 |
| | @Room Temperature (Mpa) | 28.5 | 30.1 | 30.5 | 25.5 | 29.2 | 30.0 |
| | @80° C. (Mpa) | 19.6 | 19.8 | 20.0 | 19.0 | 20.5 | 20.1 |

TABLE 2-continued

|  |  | | | | | | |
|---|---|---|---|---|---|---|---|
| T-Peel Strength | @-20° C. (N/25 mm) | 250 | 287 | 320 | 270 | 310 | 304 |
|  | @Room Temperature (N/25 mm) | 245 | 250 | 250 | 245 | 240 | 260 |
|  | @80° C. (N/25 mm) | 220 | 235 | 245 | 230 | 240 | 245 |
| Fracture Morphology in T-Peel Strength Test at 80° C. | | Cohesive Failure | Cohesive Failure | Cohesive Failure | Cohesive Failure | Cohesive Failure | Cohesive Failure |

|  |  | Example 12 | Example 13 | Example 14 | Comparative Example 2 | Comparative Example 3 |
|---|---|---|---|---|---|---|
| BisA Epoxy Resin [mass parts] | | 50 | 50 | 50 | 50 | 50 |
| Urethane-Modified Epoxy Resin [mass parts] | | 30 | 30 | 30 | 0 | 30 |
| Rubber-Modified Epoxified Resin [mass parts] | | 20 | 20 | 20 | 50 | 20 |
| 3-Layered Core-Shell Particles (I) [mass parts] | | | | | 30 | |
| 3-Layered Core-Shell Particles (II) [mass parts] | | 15 | 20 | 30 | | |
| 2-Layered Core-Shell Particles [mass parts] | | | | | | 30 |
| Curing Agent [mass parts] | | 6.5 | 6.5 | 6.5 | 6.5 | 6.5 |
| Catalyst [mass parts] | | 1.3 | 1.3 | 1.3 | 1.3 | 1.3 |
| Silica [mass parts] | | 5 | 5 | 5 | 5 | 5 |
| Tensile Shear Strength | @-20° C. (Mpa) | 20.6 | 21.5 | 22.0 | 16.0 | 20.8 |
|  | @Room Temperature (Mpa) | 22.1 | 23.5 | 25.4 | 30.0 | 28.0 |
|  | @80° C. (Mpa) | 20.2 | 20.3 | 20.8 | 14.0 | 13.5 |
| T-Peel Strength | @-20° C. (N/25 mm) | 310 | 320 | 301 | 300 | 320 |
|  | @Room Temperature (N/25 mm) | 285 | 290 | 300 | 150 | 235 |
|  | @80° C. (N/25 mm) | 263 | 259 | 290 | 135 | 105 |
| Fracture Morphology in T-Peel Strength Test at 80° C. | | Cohesive Failure 70% | Cohesive Failure 80% | Cohesive Failure 90% | Interfacial failure | Cohesive Failure |

What is claimed is:

1. An epoxy resin composition, comprising:
   100 mass parts epoxy resin comprising a rubber-modified epoxy resin;
   5 to 100 mass parts core-shell particles; and
   a curing agent,
   1 to 50 mass % of the epoxy resin being a urethane-modified epoxy resin,
   the epoxy resin further including a rubber-modified epoxy resin,
   the core-shell particles having acrylonitrile included as a monomer used when a shell layer is produced, and/or
   the core-shell particle having a structure of at least three layers of a core layer, an interlayer, and the shell layer.

2. The epoxy resin composition according to claim 1, wherein
   the core-shell particles have acrylonitrile included as the monomer used when the shell layer is produced and
   the core-shell particles have the structure of at least three layers of the core layer, the interlayer, and the shell layer.

3. The epoxy resin composition according to claim 1, wherein
   a glass transition temperature of the shell layer is at least 50° C., and
   a glass transition temperature of an inner layer, which is adjacent to the shell layer, is no more than −30° C.

4. The epoxy resin composition according to claim 1, wherein
   the core-shell particles have the core layer, the interlayer, and the shell layer,
   a glass transition temperature of the core layer is at least 50° C.,
   a glass transition temperature of the interlayer is no more than −30° C., and
   a glass transition temperature of the shell layer is at least 50° C.

5. The epoxy resin composition according to claim 1, wherein an average of primary particle diameters of the core-shell particles is 50 to 500 nm.

6. The epoxy resin composition according to claim 1, which is used as a structural adhesive.

7. The epoxy resin composition according to claim 1, wherein the epoxy resin includes 10 to 100 mass parts of the core-shell particles.

8. The epoxy resin composition according to claim 1, wherein 30 to 50 mass % of the epoxy resin is the urethane-modified epoxy resin.

9. The epoxy resin composition according to claim 1, wherein the shell layer is a methyl methacrylate copolymer.

\* \* \* \* \*